United States Patent [19]

Nakashima et al.

[11] Patent Number: 5,155,903
[45] Date of Patent: Oct. 20, 1992

[54] ELECTRICAL COMPONENT PLACING APPARATUS AND PLACING METHOD THEREFOR

[75] Inventors: Toshiaki Nakashima, Fukuoka; Toru Akasaka, Chikushino, both of Japan

[73] Assignee: Matsushita Electric Industrial Co., Ltd., Osaka, Japan

[21] Appl. No.: 686,460

[22] Filed: Apr. 17, 1991

[30] Foreign Application Priority Data

Apr. 18, 1990 [JP] Japan .................................. 2-101981
Apr. 18, 1990 [JP] Japan .................................. 2-101982

[51] Int. Cl.⁵ ........................... H05K 3/30; B23P 19/00
[52] U.S. Cl. ........................................ 29/832; 29/740; 29/840
[58] Field of Search ............... 29/740, 832, 705, 840, 29/759

[56] References Cited

U.S. PATENT DOCUMENTS

| | | | |
|---|---|---|---|
| 4,593,462 | 6/1986 | Yagi et al. | 29/832 X |
| 4,706,379 | 11/1987 | Seno et al. | 29/740 |
| 4,794,689 | 1/1989 | Seno et al. | 29/740 |
| 4,868,973 | 9/1989 | Fujishiro | 29/740 |
| 4,905,370 | 3/1990 | Hineno et al. | 29/740 |
| 4,979,286 | 12/1990 | Nakayama et al. | 29/740 |
| 4,984,354 | 1/1991 | Mohara et al. | 29/740 |
| 5,033,185 | 7/1991 | Hidese | 29/740 |

FOREIGN PATENT DOCUMENTS

| | | | |
|---|---|---|---|
| 1-17499 | 1/1989 | Japan | 29/705 |
| 1-261899 | 10/1989 | Japan . | |

Primary Examiner—Carl J. Arbes
Attorney, Agent, or Firm—Lowe, Price, LeBlanc & Becker

[57] ABSTRACT

There are irregularities in the thicknesses, longitudinal and lateral sizes of electrical components, which cause placement errors of the electrical components on substrates. Therefore, the thickness, longitudinal and lateral sizes of the electrical component is measured during feeding the electrical component to the substrate. The irregularity of the thicknesses of the electrical components can be corrected by regulating the vertical stroke of a nozzle. The temporary values of the longitudinal and lateral sizes of the electrical component are registered in advance in a computer. When the measured values fall within the allowable range of the temporary values, the correction value of the temporary value based on the measured value is corrected, and the correction value is registered as a new reference value in the computer.

5 Claims, 6 Drawing Sheets

ELECTRICAL COMPONENT PLACING APPARATUS AND PLACING METHOD THEREFOR

BACKGROUND OF THE INVENTION

1. Field of the Invention

This invention relates to an electrical component placing apparatus and placing method therefor and, more particularly, to eliminating pickup and placement mistakes of an electrical component by measuring the component thickness with a measuring unit to obtain an average thickness value, and regulating the rising or falling stroke of a component pickup nozzle based on the average value. This invention also relates to means for placing an electrical component by correcting a reference value for judging whether or not a pick and place head erroneously transfer and place another electrical component when transferring and placing the electrical component to a substrate by the pick and place head.

2. Description of the Prior Art

Conventional electrical component placing apparatus is adapted to rise or fall a nozzle of a pick and place head in an electrical component supply unit, to pick up an electrical component, and to pick and place the electrical component thus picked up on a substrate positioned by a positioning unit.

However, since the electrical component placing apparatus is operated at a high speed, the apparatus tends to frequently pick up erroneously the electrical component by a nozzle. One of the causes resides in an irregularity in the heights of the lower ends of the nozzles. Therefore, the present assignee has previously proposed the solving means (Japanese Patent Laid-open No. 1-261899 (corresponding to U.S. patent application Ser. No. 07/336,903), now U.S. Pat. No. 5,033,185. However, the causes of the erroneous pickup is not only the above-described ones but an irregularity in the thicknesses of electrical components. More specifically, since the same electrical components have molding errors, the thicknesses of the electrical components are irregular. If the thickness of the electrical component is excessively small, the lower end of the nozzle cannot be landed on the upper surface of the electrical component, and the nozzle fails to pick up the electrical component. On the other hand, if the thickness of the electrical component is excessively large, the lower end of the nozzle strongly impacts on the upper surface of the electrical component, and the component is damaged.

If the thickness of the electrical component is excessively small, even if the nozzle does pickup the component and moves it for placement on the substrate, the electrical component cannot be landed on the substrate. If nozzle suction is released before the electrical component is landed on the substrate, the electrical component is naturally dropped and there may be deviation of its position on the substrate. If the thickness of the electrical component is excessively large, the electrical component landed on the substrate is pressed by the nozzle to be damaged. Further, when the pick and place head picks up the electrical component of the electrical component supply unit, the pick and place head might erroneously pick up another electrical component and pick and place the electrical component on the substrate.

In order to prevent the placing and picking failure of the electrical component as described above, the reference values of the sizes of the respective electrical components are registered in advance in a computer, the electrical component to be placed and picked on a substrate by a pick and place head is observed by a recognition unit such as a camera, whether or not the size of the electrical component measured by the recognition unit coincides with the reference value is judged by the recognition unit, the electrical component is picked and placed on the substrate as it is if the size of the electrical component coincides with the reference value, while the electrical component is paused to be picked and placed on the substrate if the size of the electrical component does not coincide with the reference value.

In the conventional means described above, it is necessary to register in advance the reference values of the sizes of the electrical components in the computer. Heretofore, the size of the electrical component is measured by a measuring instrument such as vernier calipers, and the measured value is registered as the reference value of judging good or no good of the size of the electrical component in the computer.

However, since such a method must measure a number of types of electrical components (up to 100 or more types in some cases) one by one by a manual work with the vernier calipers, a great deal of labor and time are required, and a measuring error and an inputting error to the computer feasibly occur. Further, even if the electrical components are of the same type, the respective electrical components have an irregularity in the size due to their molding errors. Thus, even if the sizes of the electrical components measured by the vernier calipers as described above are registered as the reference values of judging good or no good of the electrical component in the computer, the reliability is low, and suitable judgement of good or no good of the electrical component cannot be performed.

The size of an electrical component described in a catalog or a product manual, etc., (i.e., catalog values) is heretofore registered as a reference value in a computer. However, in case of an electrical component of a special shape, the size described in the catalog is scarcely understood which of the portion of the component is pointed out, and an input error would feasibly occur. Since the electrical components have an irregularity in the size similarly to the case by the vernier calipers, the catalog values have low reliability as the reference value of the size of the electrical component, and cannot be employed as for judging good or no good of the size of the electrical component.

SUMMARY OF THE INVENTION

Accordingly, a primary object of this invention is to provide means for eliminating a pickup error and a placing error of an electrical component on a substrate due to an irregularity in the thickness of the electrical component.

Another object of this invention is to provide means for obviating a pickup error of an electrical component due to an irregularity in the size of the electrical component.

In order to achieve this and other objects according to the present invention, there is provided an electrical component placing apparatus having an electrical component supply means, a substrate positioning means for vertically moving up or down a nozzle of a pick and place head in said electrical component supply means, sucking an electrical component to the lower end of said nozzle to be picked and placed on said substrate comprising measuring means arranged between said electrical component supply means and said positioning means for measuring the thickness of said electrical component sucked to said nozzle, and a computer for calculating an average value of the thickness of the electrical component from the measured value of the electrical component from said measuring means.

With the arrangement described above, the thickness of the electrical component sucked to the lower end of the nozzle of the pick and place head is measured by the measuring means which is positioned between the component supply means and the substrate. The measurement is carried out for a number of types of electrical components, and an average value of the thicknesses of the electrical components is calculated by the computer. The vertical stroke of the nozzle is regulated based on the average value of the electrical components to eliminate the pickup error or the placing error.

These and other objects and features of the present invention will become apparent from the following detailed description in conjunction with the attached drawings.

DESCRIPTION OF THE PREFERRED EMBODIMENT

An embodiment of an electrical component placing apparatus according to the present invention will now be described with reference to the accompanying drawings.

Figure 1:
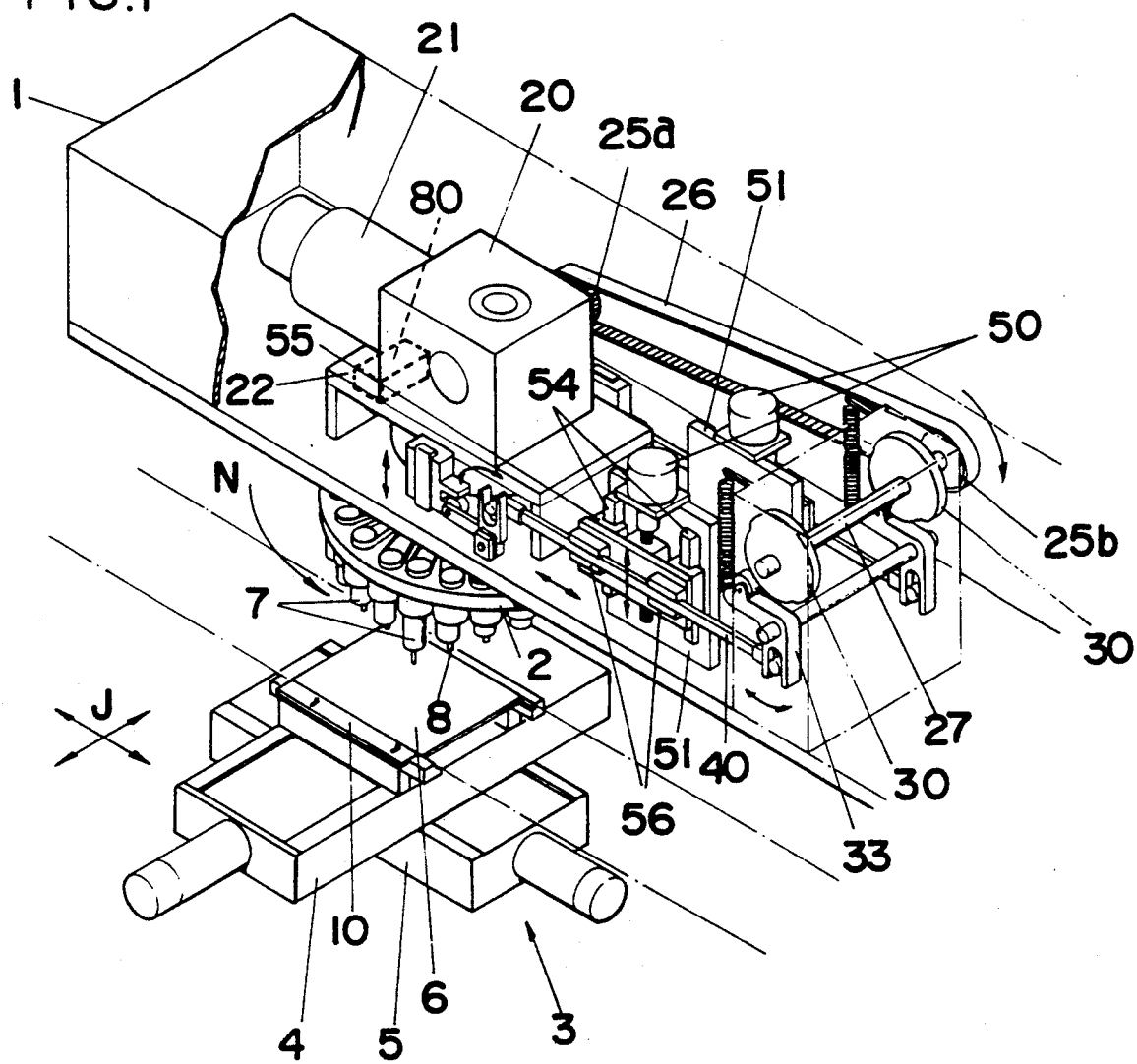
FIG. 1 is a perspective view of an electrical component placing apparatus according to an embodiment of the present invention.

FIG. 1 is a perspective view of an electrical component placing apparatus of the invention. The electrical component placing apparatus of the embodiment comprises a housing 1, a rotary head 2 rotatably mounted on the lower portion of the housing 1, and an electrical component positioning unit 3 having X-Y tables 4 and 5. A substrate 6 is positioned by a clamp 10 on the positioning unit 3. The substrate 6 is movable by sliding in an arbitrary direction J of the X-Y tables 4 and 5. A number of pickup and placement heads 7 are aligned along the circumferential direction on the lower surface of the rotary head 2, and each head 7 has a nozzle 8 projecting downward Referring to FIG. 2, a spring 9 is provided to allow slight upward or downward movement of the nozzle 8. The nozzle 8 sucks an electrical component C onto the lower end thereof by means of vacuum pressure.

Figure 3:
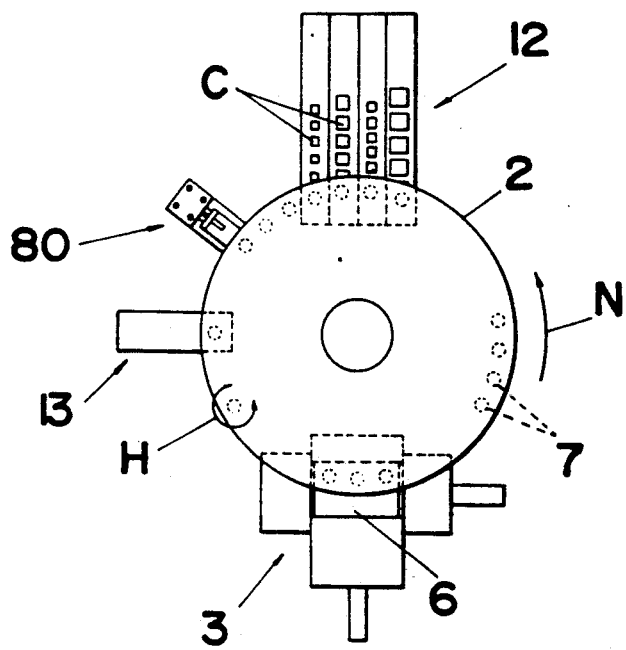
FIG. 3 is a plan view of a rotary head.

FIG. 3 is a plan view of the rotary head 2. An electrical component supply unit 12 is arranged at an opposite side to the positioning unit 3. The supply unit 12 picks up the electrical component C of the supply unit 12 by indexing of the rotary head 2 in a direction N, as will be described later, and then vertical upward or downward movement of the nozzle 8, to pick up and place the electrical component C on the substrate 6.

Figure 5:
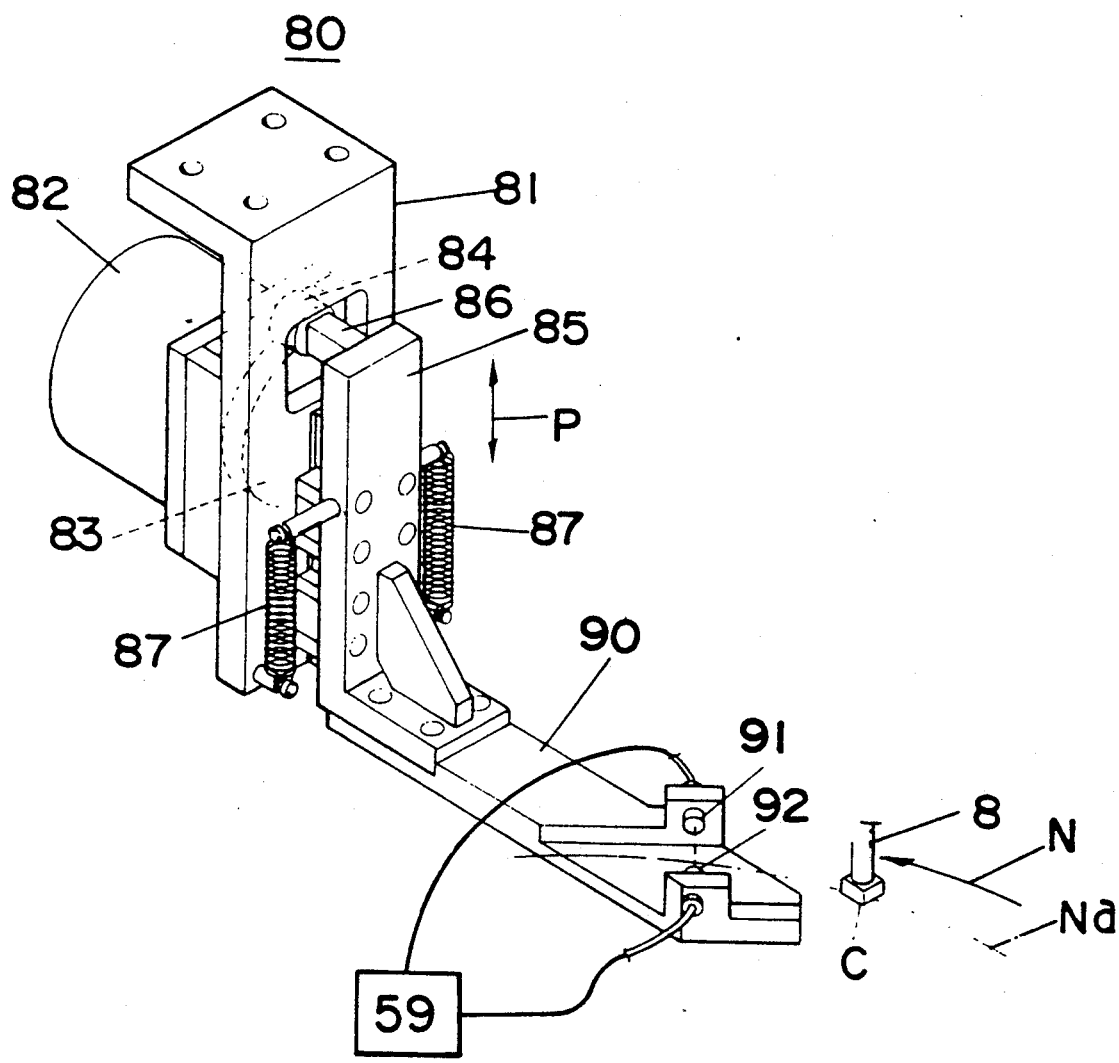
FIG. 5 is a perspective view of a measuring unit.

In FIG. 3, a recognition unit 13 is arranged between the electrical component supply unit 12 and the positioning unit 3 to detect the positional deviations of the electrical component C sucked to the lower end of the nozzle 8 in the X-Y directions and rotating direction. The positional deviations of the electrical component C in the X-Y directions are corrected by moving the substrate 6 in the X-Y directions. The positional deviation of the electrical component in the rotating direction is corrected by driving an electric motor 14 (see FIG. 2) mounted on the rotary head 2 to rotate the nozzle 8 of the head 7 through a belt 15, a spline shaft 16, gears 17 and 18, etc., about the nozzle longitudinal axis in a direction H (see FIG. 3). A measuring unit 80 is arranged on a moving passage from the electrical component supply unit 12 to the positioning unit 3 to measure the thickness of the electrical component C sucked to the nozzle 8. The detailed structure of the measuring unit 80 will be described with reference to FIGS. 5 and 6.

The measuring unit 80 has a mounting bracket 81, a pulse motor 82 mounted on the back surface of the bracket 81, a cam 83 driven by the pulse motor, a cam follower 84 in contact with the peripheral surface of the cam, and an elevation plate 85 coupled to the cam follower 84 through a coupling member 86. The elevation plate 85 is coupled to the bracket 81 through spring elements 87 and 87 for biasing downward the elevation plate 85. When the cam 83 is rotated by the motor 82, the elevation plate 85 is raised or lowered in upward or downward directions P. The measuring unit 80 further has a guide rail 88 mounted on the front surface of the bracket 81, and a slider 89 mounted on the back surface of the elevation plate 85. The slider 89 is vertically moved up or down along the guide rail 88. A supporting plate 90 is mounted at the lower end of the elevation plate 85 to project horizontally forward, and measuring elements 91 and 92 are arranged on the end of the supporting plate 90 along the conveying passage of the nozzle 8.

Figure 6:
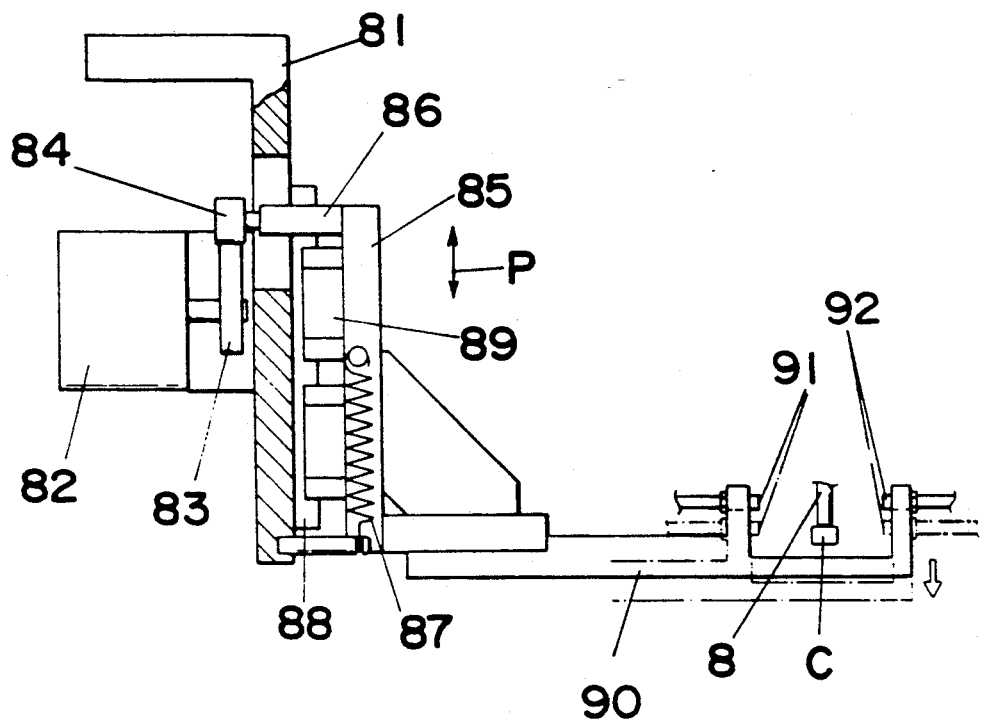
FIG. 6 is a side view of the measuring unit.

When the pulse motor 82 is driven to rotate the cam 83, the supporting plate 90 which follows the cam surface through the cam follower 84 is moved down (from solid to broken lines in FIG. 6). Thus, the measuring unit 80 measures the thickness of the electrical component C sucked to the lower end of the nozzle 8, and inputs the measured result to a computer 59 (to be described later). The rotating speed of the cam 83 is synchronized with the indexing of the rotary head 2. The pulse motor 82 is driven to measure the thickness of the electrical component C during the intermittent stoppage of the rotary head 2.

A driving mechanism of the head 7 will be described with reference to FIGS. 1 and 2.

The driving mechanism of the head 7 has a driver box 2 arranged directly above the rotary head 20 in the housing 1, a driver 21 of the driver box 20, and a supporting frame 22. The rotary head 2 is mounted on the output shaft 23a of the driver box 20, and the rotary head 2 is indexed by the driver 21. The driver 21 is a servo motor. The power of the driver 21 is transmitted to the head 7 through a transmission line to be described below, and the head is moved up or down at a predetermined stroke.

The driving mechanism further has a pulley 25a attached to another output shaft 23b the driver box 20, a second pulley 25b, a timing belt 26 engaged between the pulleys 25a and 25b, and a rotational shaft 27 of the pulley 25b. Cams 30 and 30 are mounted at two positions of the electrical component supply unit 12 and the positioning unit 3 at both ends of the rotational shaft 27 so as to vertically move up or down the head 7. Since the vertically moving mechanisms of the head 7 of the electrical component supply unit 12 and the positioning unit 3 are constructed in the same manner, the vertically moving mechanism of the positioning unit 3 side will be described with reference to FIG. 2.

The vertically moving mechanism of the positioning unit 3 has a cam follower 31 in contact with the peripheral surface of a cam 30 and supported to a hook-shaped lever 33. A coil spring 34 is energized to bring the cam follower 31 into pressure contact with the cam 30. The cam follower 31 moves up or down to follow the rotation of the cam 30, and the lever 33 is oscillatorily fluctuated in a direction of an arrow a at the pin 32 as a center. In other words, these members 30 to 34 constitute a first driving direction converter 35 for converting the rotating motion of the cam 30 into the oscillating motion of the lever 33.

A rod 40 is horizontally arranged, and rollers 41 and 42 are respectively supported at opposite ends of the rod 40. One roller 41 is engaged with a groove 36 formed on the lower end of the lever 33, and the other roller 42 is engaged with the groove 44 of the other lever 43. When the lever 33 is oscillatorily fluctuated, the rod 40 is reciprocated in a horizontal direction b, and the lever 43 is rotated about 45 in the direction of an arrow c in FIG. 2.

Figure 2:
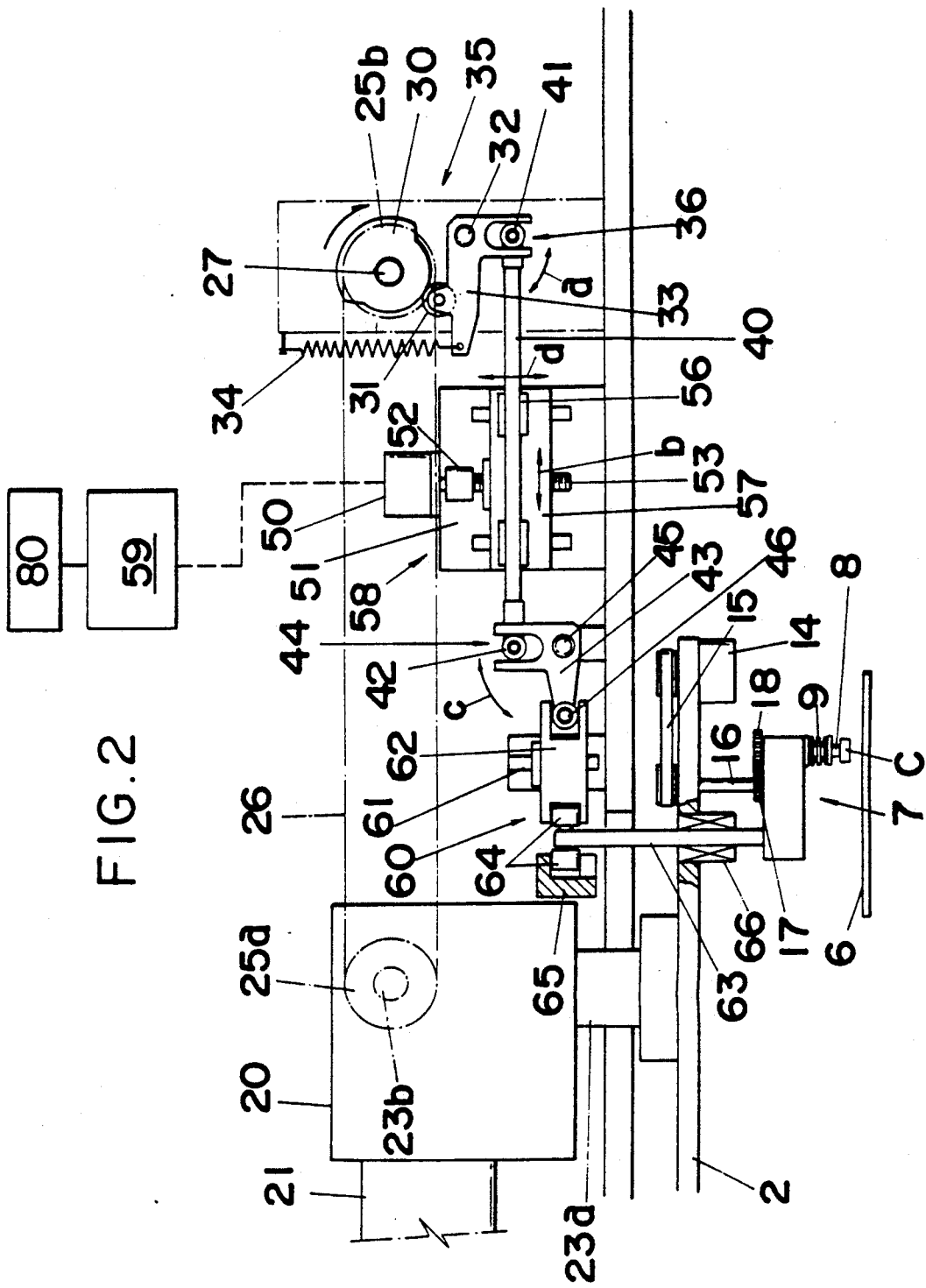
FIG. 2 is a front view of the electrical component placing apparatus of the embodiment.

A pulse motor 50 is arranged above the rod 40 ON a supporting bracket 51, and a coupling 52 and a threaded rod 53 are arranged around the pulse motor 50, and the rod 40 is vertically moved up or down in a vertical direction d in FIG. 2 by the pulse motor 50. The motor 50 is automatically controlled by a computer 59. Data of the thicknesses of respective electrical components to be picked and placed sequentially on the substrate 6 are input in advance in the computer 59, and the pulses based on the data are oscillated from the computer 59 to control the motor 50. The rod 40 driven by the motor 50 is moved up or down, and the motion of the rod 40 is transmitted to the elevation shaft 63 of the head 7. Guide members 54 and 55 (see FIG. 1) for guiding the rod 40 upward or downward, a guide member 56 for guiding the horizontal reciprocations and a supporting member 57 for supporting the guide members 55 and 56 are provided.

Figure 4:
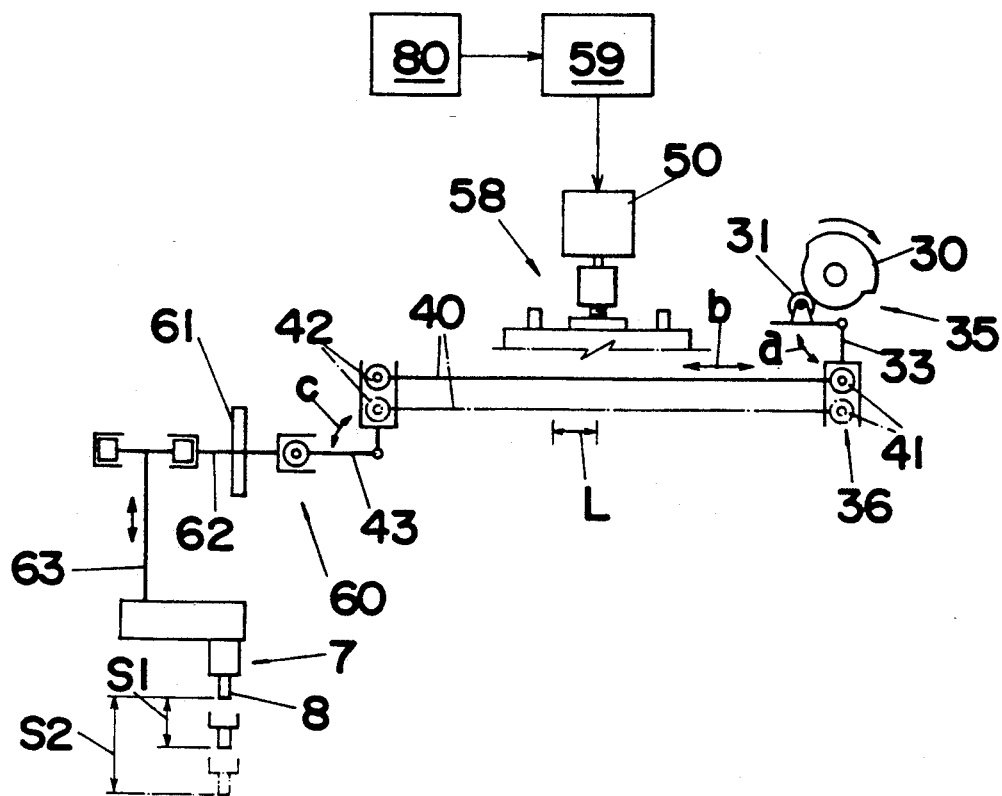
FIG. 4 is a front view of a driver.

A second driving direction converter 60 is provided, and has a guide body 61 mounted on the bottom of the housing 1, and a slider 62 moving upward or downward along the guide body 61, etc. Grooves are formed at both sides of the slider 62. A roll 46 of the lever 43 is engaged with the one groove, and a roll 64 mounted at the top of the elevation shaft 63 of the head 7 is engaged with the other groove. A ring guide 65 of the other roll 64 is attached to the top of the shaft 63, and an elevation guide 66 of the shaft 63 is provided. FIG. 4 simply shows a transmission mechanism for transmitting power from the above-described driver 21 to the elevation shaft 63. The operation of the transmission mechanism will be described with reference to FIG. 4.

The lever 33 is oscillatorily fluctuated by the continuous rotation of the cam 30 in a direction of an arrow a in FIG. 4. Simultaneously, the rod 40 is reciprocated in a horizontal direction b in FIG. 4. Then, the other lever 43 is oscillatorily fluctuated in a direction of an arrow c in FIG. 4, and the slider 62 is moved up or down along the guide body 61. Therefore, the head 7 coupled to the slider 62 through the shaft 63 is moved up or down.

In the transmission mechanism described above, as indicated by solid lines in FIG. 4, when the rod 40 is disposed at a high position and the roll 41 is advanced deeply into the groove 36 of the lever 33, the rod 40 is reciprocated in a short stroke by the lever 33 so that the stroke L of the horizontal direction is short and hence the other lever 43 is oscillated in a small angular interval 50 the vertical stroke S1 of the head 7 is correspondingly short. On the contrary, as indicated by broken lines in FIG. 4, when the rod 40 is disposed at a low position and the roll 41 is advanced shallowly to the groove 36, the rod 40 is reciprocated at a long stroke, and hence the vertical stroke S2 of the head 7 is long. As described above, the vertical stroke of the head 7 is varied according to the height of the rod 40. Therefore, according to the apparatus of this invention, the motor 50 to be automatically controlled by the computer 59 is driven to alter the height of the rod 40, thereby regulating the length of the stroke of the head 7 set according to the shape of the cam 30. As described above, the rod 40 and the vertically moving means for the rod 40 constitute a regulator 58 of a transmission distance to be transmitted from the first driving direction converter 35 to a second driving direction converter 60.

The apparatus of the invention is constructed as described above, and the operation of the apparatus will be described with reference to FIG. 7.

The head 7 which sucks the electrical component C in the electrical component supply unit 12 is transferred to the positioning unit 3 by indexing the rotary head 2. The measuring unit 80 is arranged on the way of the transfer passage. The thickness of the electrical component C sucked to the lower end of the nozzle 8 is measured by the measuring unit 80, the measurement signal from the measuring unit 80 is input to the computer 59, which calculates the average value of the measured values, corrects the thickness with the thicknesses D1 to Dn of the respective electrical components C1 to Cn registered in advance with the computer 59, then controls the pulse motor 50 for driving the regulator 58 based on the correction value, and regulates the vertical stroke of the head 7.

Figure 7:
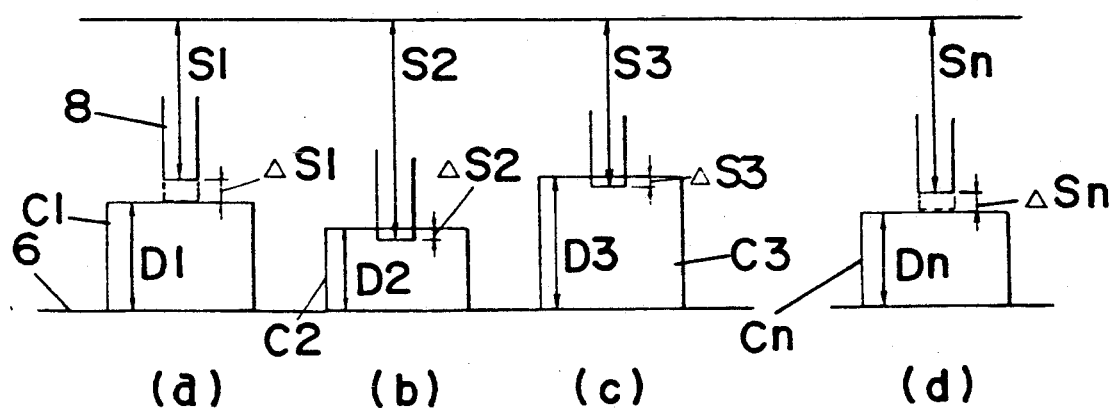
FIG. 7 is a front view of a portion during operation.

In FIG. 7, S1, S2, . . . , Sn denote vertical strokes based on the thicknesses D1 to Dn of the electrical components registered in advance in the computer 59. As shown in FIG. 7, stroke errors $\Delta S1, \Delta S2, \ldots, \Delta Sn$ exist due to the irregularity in the thicknesses of the electrical components C1 to Cn. However, the errors $\Delta S1$ to $\Delta Sn$ are corrected by measuring the thicknesses of the electrical components C1 to Cn with the measuring unit 80, correcting the thicknesses D1 to Dn registered in the computer 59, and regulating the vertical strokes of the head 7 based on the correction values. Therefore, the nozzle 8 can reliably pick up the electrical component C. Of course, when the vertical stroke of the head 7 due to the irregularity in the thickness of the electrical component C is corrected as described above, the vertical stroke of the head 7 of the positioning unit 3 is corrected properly, and the electrical component C sucked to the nozzle 8 can be reliably placed on the substrate 6.

A method of eliminating the pickup error due to the irregularity, in the thickness of the electrical component will now be described.

Before the electrical component is picked and placed on the substrate, reference values for judging good or no good of a number of types of electrical components Cl to Cn to be picked and placed on the substrate are registered in advance in the computer 59. The catalog values are input as the temporary values of the reference values to the computer 59.

Then, the electrical components Cl to Cn are picked and placed on a first substrate 6. In this case, the size of the electrical component C is measured by the recognition unit 13 on the way of transferring the electrical component C to the substrate 6 by the head 7, whether or not the measured value coincides with the temporary value of the reference value based on the catalog value is judged to inspect whether or not another electrical component C is erroneously being fed by the head 7. If the error is judged to be within the allowable range so that the size of the electrical component C coincides with the reference value, the electrical component C is fed, picked and placed on the substrate 6 as is. On the other hand, if the size of the electrical component C does not coincide with the reference value, the picking and placing of the electrical component C is paused; Simultaneously, in case of the coincidence, the measured value is input to the computer 59, which calculates the average value of the temporary value and the measured value as the correction value, and registers the correction value as a new reference value for determining whether the next chip to be picked up is to be placed on the substrate.

As described above, if all the electrical components are picked and placed on the first substrate 6, electrical components C will be picked and placed on a second substrate 6. Even in this case, similarly to the case of the first substrate 6, the size of the electrical component C fed by the head 7 is measured by the recognition unit 13, and whether or not the measured value coincides with the new reference value is judged. In case of the coincidence, the electrical component C is picked and placed on the substrate 6 as is, while in case of discordance, the picking and placing of the electrical component is paused. Simultaneously, in case of the coincidence, the measured value is input to the computer 59, which calculates the average value of the measured value and the new reference value calculated previously further as the corrected correction value, and further registers the correction value as the new reference value.

Then, when electrical components are picked and placed on third or later substrates, the above-described operation are repeated to correct the reference value.

As described above, the electrical components C to be picked and placed on the substrate 6 are sequentially measured, the correction value based on the measured value is calculated by the computer, and the correction value is registered as the new reference value for judging good or no good of the electrical component to be picked and placed on the substrate in the computer. Then, the reliability of the reference value can be gradually raised while employing the irregularity in the size of the electrical component as the reference value data.

Figure 8:
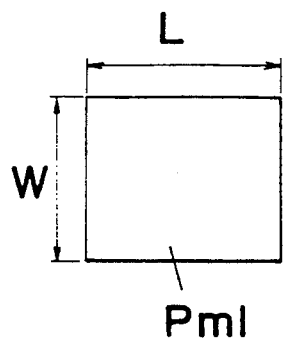
FIG. 8 is a plan view of an electrical component.
Figure 9:
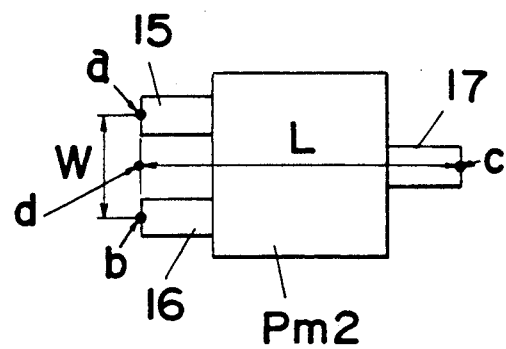
FIG. 9 is a plan view of the electrical component.

FIGS. 8 and 9 show an example of the size of an electrical component to be input as a reference value in the computer 59. An electrical component Pm1 is a square electrical component (e.g., a chip capacitor or a chip resistor). Lateral and longitudinal sizes W and L of the electrical component Pm1 are input as reference values in the computer. An electrical component Pm2 is a miniature transistor, which has three projecting electrodes 15, 16 and 17. The end midpoints a, b and c of the electrodes 15-17 of the electrical component Pm2 are detected, and an interval W between the midpoints a and b is employed as a longitudinal size. The length L of a vertical lie from the midpoint c to the bisectional point d of the midpoints a and b is used as a lateral size.

As described above, even in the case of the electrical component likewise the miniature transistor having the projecting electrodes, when the size to be input is set not from the main body portion but from the position of the feature point of the electrode such as the end midpoint of the electrode, the positional accuracy of the substrate of the electrode with respect to the electrode can be enhanced. In the embodiment described above, the electrical component placing apparatus of the rotary head type has been described as an example. However, the present invention can also be applied to an electrical component placing apparatus of other type such as for picking and placing an electrical component of an electrical component supply unit on a substrate by moving a pick and place head in X-Y directions.

According to the present invention as described above, the vertical stroke of the nozzle is corrected corresponding to the irregularity in the thickness of the electrical component, the electrical component of the electrical component supply unit can be reliably picked up, and reliably picked and placed on the substrate. The reliability of the reference value of the electrical component in the computer can be gradually enhanced by correcting the reference value of the electrical component while employing the irregularity in the size of the electrical component as the reference value data, and suitable judgement for accepting or rejecting the electrical component can be provided.

What is claimed is:

1. An electrical component placement apparatus for mounting electrical components on a surface, said apparatus comprising an electrical component supply unit, an electronic component positioning means, including a mounting head having a nozzle, for vertically moving the nozzle into suction contact with a component in the supply unit to transfer and deposit said component to said surface;

measuring means arranged between said electrical component supply unit and said surface for measuring the thickness of said electrical component sucked to said nozzle as it moved past the measuring means;

a computer means connected to the measuring means for calculating an average value of the thickness of the electrical component from the measured value of the electrical component inputted to the computer means from said measuring means; and further comprising means, connected to the computer means and the positioning means, for regulating a vertical stroke of said nozzle based on said calculated average value by said computer.

2. An electrical component placement method for mounting an electrical component on a substrate, comprising the steps of:

a) picking up the electrical component from an electrical component supply means with a mounting head having a nozzle;

b) moving the mounting head, carrying the component, toward the substrate; and c) lowering the nozzle relative to the substrate to deposit the component thereon; and including the further steps of:

inputting, into a computer controlling movement of the mounting head, temporary values of reference values indicative of the sizes of a number of types of electrical components to be picked and placed on the substrate, observing the electrical component with a recognition means during step (b) for measuring the size of the electrical component, determining whether or not the measured value falls within the allowable range of the temporary value of the reference value of the electrical component, inputting the measured value to said computer if the measured value falls within the allowable range to calculate a correction value of the temporary value based on the measured value and to register the correction value as the new reference value in said computer, then measuring the size of another electrical component of the same type by observing said electrical component with said recognition means during step (b) to pick and place the electrical component on the substrate, and determining whether or no the measured value falls within the allowable range of the new reference value, and inputting the measured value, if in the allowable range, to the computer to calculate the correction value of the new reference value based on the measured value and to register the correction value further as the new reference value in said computer.

3. An electrical component placing method according to claim 2, wherein said temporary value is a catalog value of the electrical component.

4. An electrical component placing method according to claim 2, wherein the correction value of said temporary value is an average value of said temporary value and said measured value of the size of the electrical component.

5. An electrical component placing method comprising the steps of:

picking up an electrical component from an electrical component supply means with a pick and place head provided at a rotary head while rotating said rotary head through indexing movement;

measuring the size of the electrical component with a recognition unit positioned along the path of travel of the head to obtain a measured value;

determining whether or not the measured value coincides within an allowable range with a temporary value of a reference value corresponding to the size of the electrical component and which temporary value is registered in advance in a computer;

inputting, if within the allowable range, said measured value to the computer to calculate a correction value of the temporary value based on the measured value to register in said computer the correction value as a new reference value based upon an average of prior determined correction values of the size of the electrical components; and placing the component with said pick and place head on a substrate by controlling the head based upon the correction value.

* * * * *